(12) United States Patent
Agraharam et al.

(10) Patent No.: US 7,535,114 B2
(45) Date of Patent: May 19, 2009

(54) INTEGRATED CIRCUIT DEVICES INCLUDING COMPLIANT MATERIAL UNDER BOND PADS AND METHODS OF FABRICATION

(75) Inventors: Sairam Agraharam, Phoenix, AZ (US); Rahul N. Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 400 days.

(21) Appl. No.: 11/301,557

(22) Filed: Dec. 13, 2005

(65) Prior Publication Data

US 2007/0132086 A1 Jun. 14, 2007

(51) Int. Cl.
*H01L 29/40* (2006.01)
(52) U.S. Cl. .................. 257/786; 438/108; 438/612

(58) Field of Classification Search ............... 257/696, 257/784, 786; 438/117, 612, 666, 108, 614, 438/637, 654
See application file for complete search history.

(56) References Cited

U.S. PATENT DOCUMENTS

| 6,358,836 | B1 * | 3/2002 | Lu et al. ............ 438/618 |
| 6,472,306 | B1 * | 10/2002 | Lee et al. ........... 438/623 |
| 6,605,525 | B2 * | 8/2003 | Lu et al. ............ 438/617 |

* cited by examiner

*Primary Examiner*—Roy K Potter
(74) *Attorney, Agent, or Firm*—Kerry Tweet (57) ABSTRACT

An integrated circuit device includes a die having an interconnect structure formed over a surface thereof. A volume of compliant material located within the interconnect structure underlies one or more bond pads disposed on an uppermost layer of the interconnect structure. The compliant material may absorb stresses exerted on the interconnect structure during assembly, testing, or subsequent operation. Other embodiments are described and claimed.

27 Claims, 5 Drawing Sheets

INTEGRATED CIRCUIT DEVICES INCLUDING COMPLIANT MATERIAL UNDER BOND PADS AND METHODS OF FABRICATION

FIELD OF THE INVENTION

The disclosed embodiments relate generally to the manufacture of integrated circuit devices and, more particularly, to devices including a compliant material disposed in the interconnect structure underneath a bond pad.

BACKGROUND OF THE INVENTION

An integrated circuit (IC) device comprises a semiconductor die in which circuitry has been formed, this circuitry including a collection of circuit elements such as transistors, diodes, capacitors, resistors, etc. To provide electrical connections amongst devices on the die and between the die and a next-level component (e.g., a package substrate), an interconnect structure is formed over a surface of the die. The interconnect structure may comprises a number of levels of metallization, each layer of metallization separated from adjacent levels by a layer of dielectric material and interconnected with the adjacent levels by vias. The dielectric layers of the interconnect structure are often each referred to as an "interlayer dielectric" (or "ILD"), and a common material used to fabricate these ILD layers is $SiO_2$. The metallization on each layer comprises a number of conductors (e.g., traces) that may route signal, power, and ground lines to and from the circuitry formed on the die.

For some IC device applications, it may be desirable to increase the I/O (input/output) density of a semiconductor die while also reducing the size of the die. To achieve such a result, it may be necessary to decrease the spacing between conductive traces in the interconnect structure formed on the die. Space reductions include reducing the spacing between traces in the same level of metallization, as well as reducing the spacing between traces in adjacent metallization levels. As the spacing between conductors of an interconnect structure decreases, the potential for coupling capacitance between closely spaced traces and propagation delays may significantly increase. The coupling capacitance and propagation delays may be minimized by reducing the dielectric constant of the material that separates the conductive traces of the interconnect structure. Thus, manufacturers of IC devices may turn to dielectric materials having a lower dielectric constant—e.g., "low-k" dielectrics—to construct the ILD layers of the interconnect structure. Examples of such low-k dielectric materials include carbon doped oxide (CDO), fluorinated silicon glass (FSG), aerogels, xerogels, nanoporous silicon dioxide, and benzocyclobutane (BCB). However, these low-k dielectrics may have poor mechanical integrity in comparison to traditional dielectric materials (e.g., $SiO_2$) and, therefore, may be more susceptible to cracking and/or delamination during assembly (e.g., wirebonding) and testing.

DETAILED DESCRIPTION OF THE INVENTION

Figure 1:
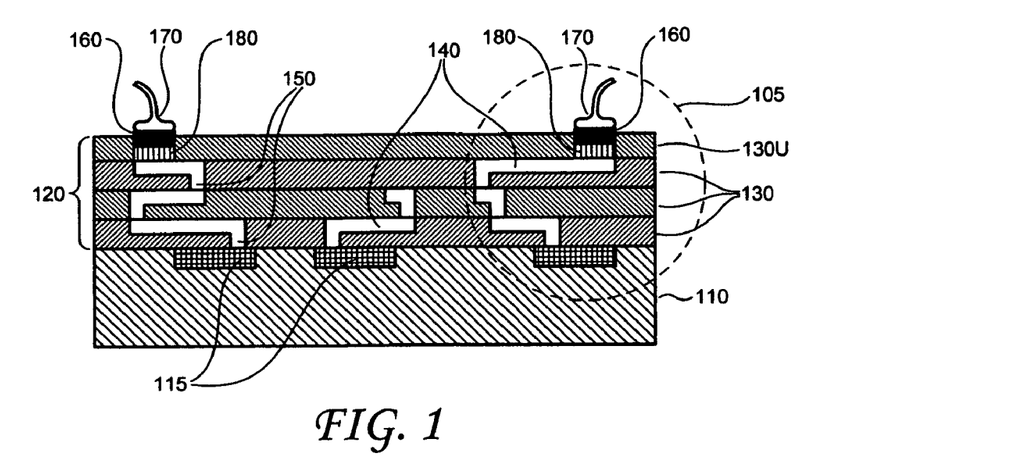
FIG. 1 is a schematic diagram illustrating an embodiment of an integrated circuit device including a compliant material disposed in the interconnect structure under one or more bond pads.

Referring now to FIG. 1, illustrated is an embodiment of an integrated circuit (IC) device 100 including a compliant material disposed in the interconnect structure under one or more bond pads. The IC device 100 comprises a die 110 in which circuitry 115 has been formed. The circuitry 115 formed in die 110 may include a number of circuit elements (e.g., transistors, diodes, capacitors, resistors, etc.), as well as various signal lines that interconnect these elements. The die 110 may comprise any suitable semiconductor material, such as silicon (Si), silicon-on-insulator (SOI), gallium arsenide (GaAs), etc.

Disposed on the die 110 is an interconnect structure 120. The interconnect structure 120 includes a number of levels of metallization, each level of metallization comprising a layer of dielectric material 130 in which a number of conductors 140 (e.g., traces) has been formed. The conductors 140 in any given level of metallization are separated from the conductors of adjacent levels by the dielectric material 130, and the conductors 140 of adjacent levels are electrically interconnected by conductive vias 150 extending between these levels. The conductors 140 and vias 150 may comprise any suitable conductive material, such as copper (Cu), aluminum (Al), gold (Au), or silver (Ag), as well as alloys of theses and/or other metals. The dielectric layers 130 may comprise any suitable dielectric, and in one embodiment the dielectric layers comprise a "low-k" dielectric material. Examples of suitable low-k dielectric materials include carbon doped oxide (CDO), fluorinated silicon glass (FSG), aerogels, xerogels, nanoporous silicon dioxide, and benzocyclobutane (BCB).

Disposed at the uppermost layer 130U of the interconnect structure 120 is a number of bond pads 160. The bond pads 160 may comprise any suitable conductive material, such as copper, aluminum, gold, as well as alloys of these and/or other metals. In one embodiment, a bond pad 160 may comprise a stack-up of multiple levels of differing metals. Each of the bond pads 160 may be electrically coupled with other conductors in the interconnect structure (although, in some embodiments, one or more of the bond pads may comprise "dummy" bond pads). The bond pads 160 may be used to form electrical connections with a next-level component, such as a package substrate or other board. For example, as shown in FIG. 1, a wire bond 170 may be coupled with one or more of the bond pads 160; however, it should be understood that other types of interconnects (e.g., solder bumps, columns, etc.) may be used to couple a bond pad with a next-level component.

Disposed in the interconnect structure at some location underlying one (or more) of the bond pads 160 is a volume of a compliant material 180. According to one embodiment, the compliant material 180 comprises any suitable material that is relatively compliant in comparison to the material of dielectric layer 130 (and perhaps relatively compliant in comparison to traditional dielectric materials, such as $SiO_2$). In another embodiment, the compliant material comprises any suitable material that can absorb the stresses resulting from subsequent assembly processes (e.g., wirebonding) and testing (e.g., reliability testing such as thermal cycling), as well as any stresses that may be present during operation of the IC device 100. According to one embodiment, in being subjected to these stresses, the compliant material 180 may undergo plastic deformation. By absorbing such stresses, the compliant material 180 under bond pads 160 may dissipate any stresses that could potentially be imparted to the dielectric layers 130—which, in one embodiment, may comprise a low-k material—thereby minimizing or preventing the occurrence of cracking and/or delamination within the interconnect structure 120.

The compliant material 180 may have any suitable material characteristics. In one embodiment, the compliant material 180 has a modulus of elasticity of up to approximately 1 GPa. According to another embodiment, the compliant material 180 comprises a viscoelastic material. As noted above, the dielectric layer 130 may, in some embodiments, comprise a low-k dielectric material, and in one embodiment the dielectric layers comprise a material having a modulus of elasticity of between approximately 5 and 40 GPa (compare to $SiO_2$, which has a modulus of elasticity of approximately 80 GPa).

In one embodiment, the compliant material 180 comprises a metal. For example, the compliant material 180 may comprise indium, tin, or lead, as well as alloys of these and/or other metals. According to one embodiment, the compliant material 180 comprises a metal having a yield strength up to approximately 70 MPa. In one embodiment, a volume of compliant material 180 comprises a stack-up of multiple layers of differing metals. According to another embodiment, the compliant material 180 comprises a polymer material. By way of example, the compliant material 180 may comprise a rubber toughened epoxy, a silicone modified polyimide, a polyimide with rubber tougheners, or a polycarbonate material. In one embodiment, the volume of compliant material 180 comprises a combination of polymer materials. In yet a further embodiment, a volume of compliant material may comprise a composite material.

Figure 2A:
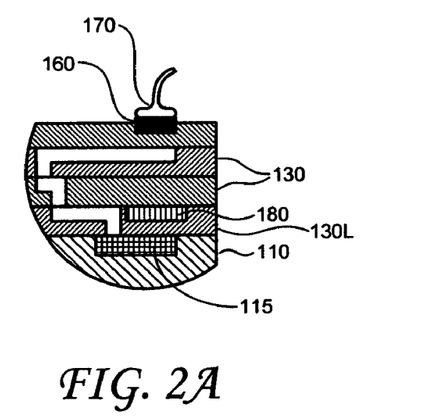
FIGS. 2A-2D are schematic diagrams illustrating further embodiments of an integrated circuit device including a compliant material disposed in the interconnect structure under one or more bond pads.
Figure 2B:
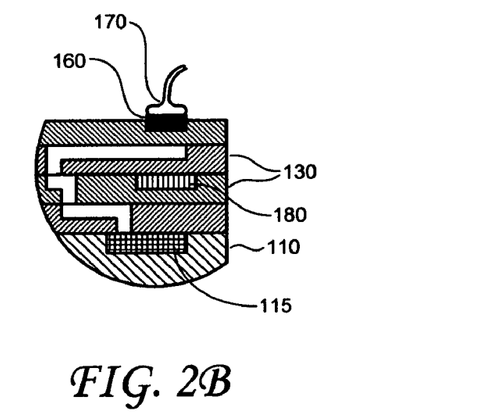

A volume of compliant material 180 may be disposed at any suitable location under a bond pad 160. In one embodiment, as shown in FIG. 1, a volume of compliant material is disposed in the uppermost dielectric layer 130U under a bond pad 160. According to another embodiment, as shown in FIG. 2A, a volume of compliant material 180 is disposed at the lowest layer 130L of the interconnect structure 120. Note that FIG. 2A (as well as each of FIGS. 2B, 2C, and 2D) shows a view of the region 105 identified in FIG. 1. According to a further embodiment, a volume of compliant material 180 is disposed at some intermediate dielectric layer 130 within the interconnect structure 120, as illustrated in FIG. 2B.

Figure 2C:
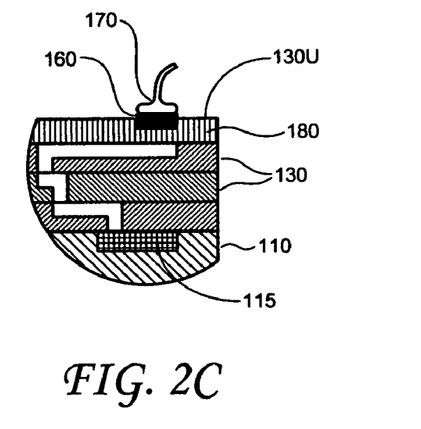
Figure 2D:
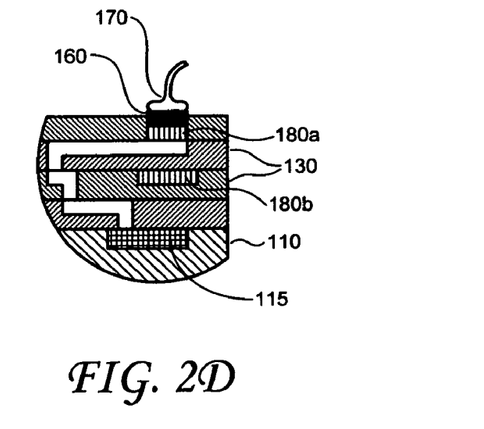

Thus far, in the illustrated embodiments, a volume of compliant material 180 comprises a single layer of the compliant material that is located under a single bond pad 160, and each bond pad has an underlying volume of compliant material (at some layer in the interconnect structure). However, in some embodiments, a portion of the bond pads 160 may have an underlying volume of compliant material 180, whereas another portion of the bond pads (e.g., one or more) may not have an underlying compliant material. Also, in some embodiments, a volume of compliant material 180 may underlie multiple bond pads 160. For example, as illustrated in FIG. 2C, an entire layer of the interconnect structure 120—e.g., the entire upper layer 130U, as shown in FIG. 2D—may comprise the compliant material 180, this layer of compliant material underlying all of the bond pads 160. It should be understood that, in other embodiments, there may be multiple regions of compliant material, each region of compliant material underlying multiple bond pads. Also, in other embodiments, there may be multiple levels of compliant material underlying a bond pad, which is illustrated in FIG. 2D, where regions of compliant material 180a, 180b underlie a bond pad 160.

Figure 3:
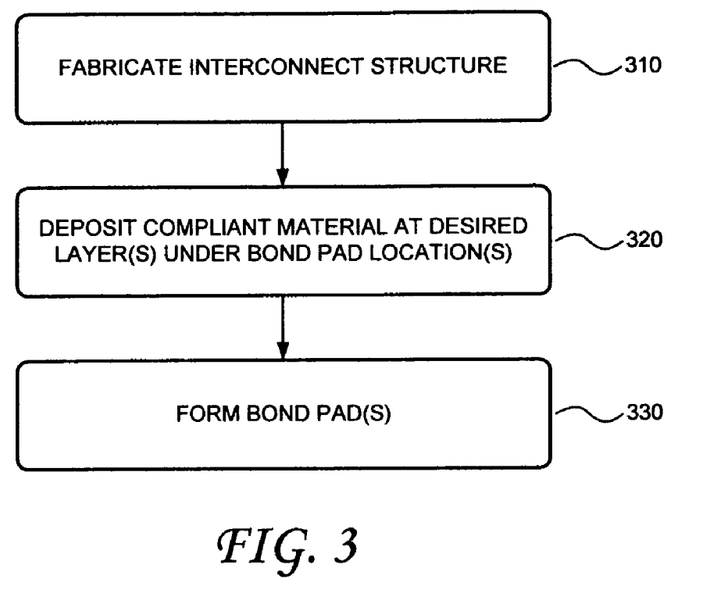
FIG. 3 is a block diagram illustrating an embodiment of a method for fabricating an integrated circuit device including a compliant material disposed in the interconnect structure under one or more bond pads.

Turning now to FIG. 3, illustrated is an embodiment of a method 300 for fabricating an integrated circuit device including a compliant material disposed in the interconnect structure under one or more bond pads. Embodiments of the method 300 of FIG. 3 are further illustrated in the schematic diagrams of FIGS. 4A through 4C, and reference should be made to these figures, as called out in the text below.

Figure 4A:
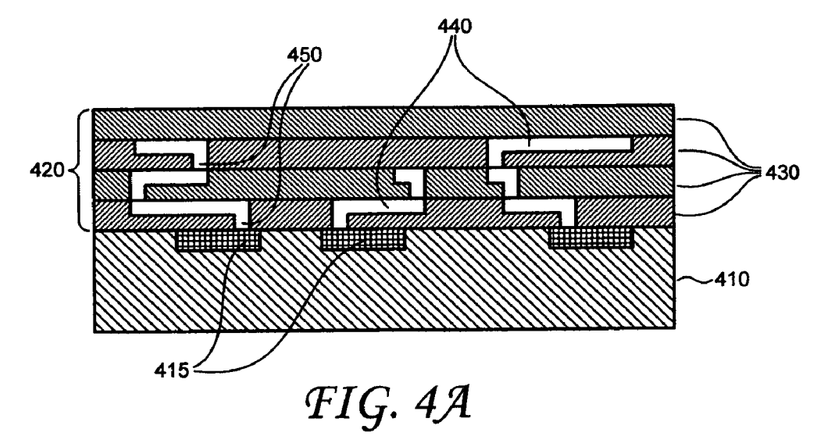
FIGS. 4A-4C are schematic diagrams illustrating embodiments of the method shown in FIG. 3.

Referring to block 310 in FIG. 3, an interconnect structure is fabricated on a die. This is illustrated in FIG. 4A, which shows a die 410 upon which an interconnect structure 420 has been formed. Die 410 may comprise any suitable semiconductor material, such as silicon (Si), silicon-on-insulator (SOI), gallium arsenide (GaAs), etc. Also, die 410 may include circuitry 415, and this circuitry may comprise a number of circuit elements (e.g., transistors, diodes, capacitors, resistors, etc.), as well as various signal lines that interconnect these elements.

The interconnect structure 420 includes a number of levels of metallization, each level of metallization comprising a layer of dielectric material 430 in which a number of conductors 440 (e.g., traces) has been formed. The conductors 440 in any given level of metallization are separated from the conductors of adjacent levels by the dielectric material 430, and the conductors 440 of adjacent levels are electrically interconnected by conductive vias 450 extending between these levels. The conductors 440 and vias 450 may comprise any suitable conductive material, such as copper (Cu), aluminum (Al), gold (Au), or silver (Ag), as well as alloys of these and/or other metals. The dielectric layers 430 may comprise any suitable dielectric, and in one embodiment the dielectric layers comprise a "low-k" ielectric material. Examples of suitable low-k dielectric materials include carbon doped oxide (CDO), fluorinated silicon glass (FSG), aerogels, xerogels, nanoporous silicon dioxide, and benzocyclobutane (BCB).

Figure 4B:
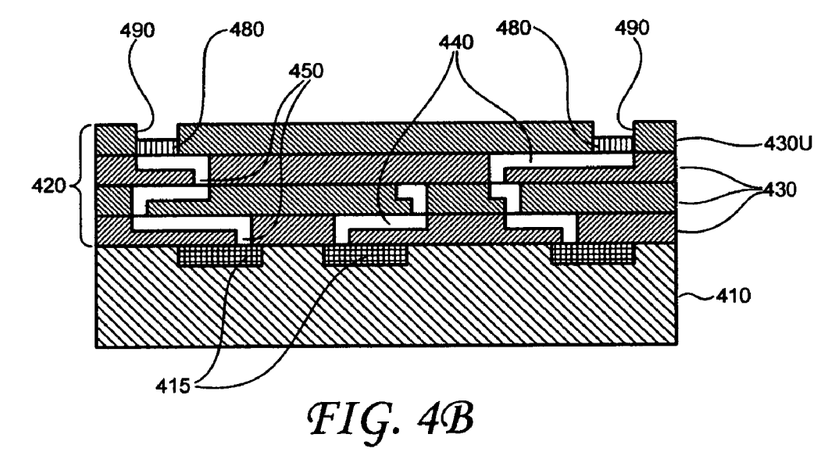

Referring to block 320 in FIG. 3, a volume of compliant material is deposited in the interconnect structure at locations proximate where bond pads are to be formed. This is illustrated in FIG. 4B, where regions of compliant material 480 have been formed in an uppermost dielectric layer 430U of the interconnect structure 420. According to one embodiment, to deposit the compliant material 480 at the desired locations, the upper dielectric layer 430U may be patterned (e.g., by depositing and patterning a photoresist, followed by a subsequent etching process) to form openings 490 at locations where bond pads are to be formed. A layer of the compliant material 480 may then be deposited in each of the openings (and perhaps over conductors—e.g., vias—located within a periphery of the opening 490). Any suitable deposition technique may be employed to deposit the compliant material. According to one embodiment, a blanket layer of the compliant material is deposited (e.g., as by a sputtering process, a chemical vapor deposition process, or a spin-on process), and the blanket layer is then lithographically patterned and etched to form regions of compliant material at desired locations. As previously noted, in one embodiment, the compliant material 480 may comprise a metal, such as indium, tin, as well as an alloy of these and/or other metals (and, in some embodiments, a region of compliant material may comprise a stack-up of multiple metal layers). However, in other embodiments, the compliant material 480 may comprise a polymer material. The regions of compliant material may have any suitable thickness, and in one embodiment, a volume of compliant material has a thickness up to approximately 25 μm.

Figure 4C:
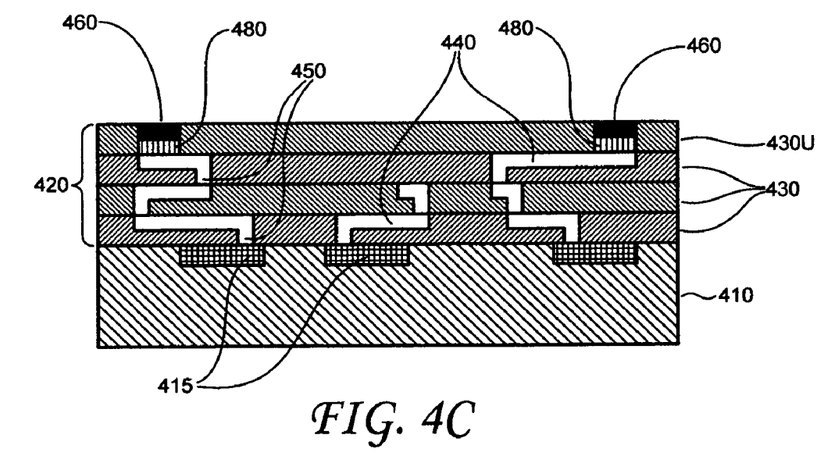

It should be understood that a volume of compliant material may be placed at any suitable location within the interconnect structure. As illustrated in FIGS. 4A-4C, a region of compliant material may be located within an upper layer 430U of an interconnect structure 420. However, as previously described, a region of compliant material may be placed at the lowest layer of an interconnect structure (see FIG. 2A) or an intermediate layer of the interconnect structure (see FIG. 2B). Also, an entire layer of the interconnect structure may comprise the compliant material (see FIG. 2C). Further, multiple regions of compliant material may be placed within the interconnect structure under a bond pad (see FIG. 2D).

As set forth in block 330, one or more bond pads are formed over each region of compliant material. This is illustrated in FIG. 4C, where bond pads 460 have been formed over the compliant material 480. The bond pads 460 may comprise any suitable conductive material (e.g., copper, aluminum, gold, as well as alloys of these and/or other metals), and may be deposited using any suitable process. In one embodiment, the bond pads 460 are deposited using an electroplating process, and in another embodiment, the bond pads are deposited using an electroless plating process. In yet another embodiment, the bond pads may be formed by depositing a blanket layer of metal (which perhaps is followed by a subsequent planarization process to remove excess metal material). According to yet a further embodiment, a blanket metal layer may be patterned lithographically and etched to form the bond pads. Also, in one embodiment, the bond pads 460 comprise a stack-up of multiple metal layers (e.g., copper, titanium, and aluminum). After bond pad formation, the uppermost layer 430U of the interconnect structure 420 may be etched back to further expose the bond pads 460 (see, e.g., FIG. 1).

Figure 5:
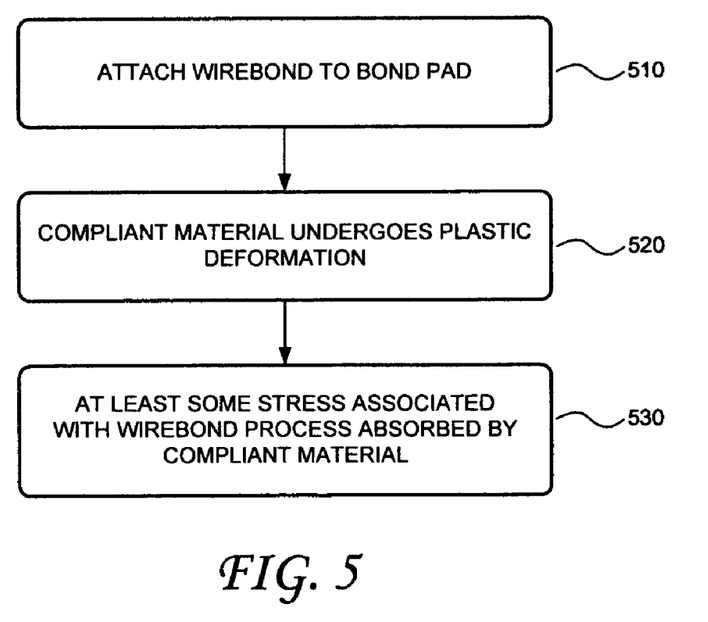
FIG. 5 is a block diagram illustrating an embodiment of a method for absorbing stress associated with wirebond attachment to a bond pad using a compliant material disposed proximate the bond pad.

Turning now to FIG. 5, illustrated is an embodiment of a method 500 for absorbing stress associated with wirebond attachment to a bond pad using a compliant material disposed proximate the bond pad. As set forth in block 510, a wirebond is attached to a bond pad (see, e.g., FIG. 1, elements 170 and 160). As set forth in block 520, a volume of compliant material (see, e.g., FIG. 1, element 180) positioned under this bond pad undergoes plastic deformation during attachment of the wirebond. This plastic deformation may result from compressive forces exerted on the bond pad (and underlying interconnect structure) by a wirebonding machine. Referring to block 530, stresses that may have otherwise been exerted upon the interconnect structure (e.g., the dielectric layers, which may comprise a low-k material) are absorbed, at least in part, by the compliant material as a result of the compliant material's plastic deformation. According to some embodiments, the compliant material does not rebound from this plastic deformation (e.g., the compliant regions may comprise a viscoelastic material that undergoes predominantly entirely plastic deformation). However, although in the above-described embodiments the deformation of the compliant material is plastic deformation, it should be understood that the disclosed embodiments are not limited to plastic deformation. For example, in some embodiments, the compliant regions may comprise a material that undergoes both plastic and elastic deformation.

Figure 6:
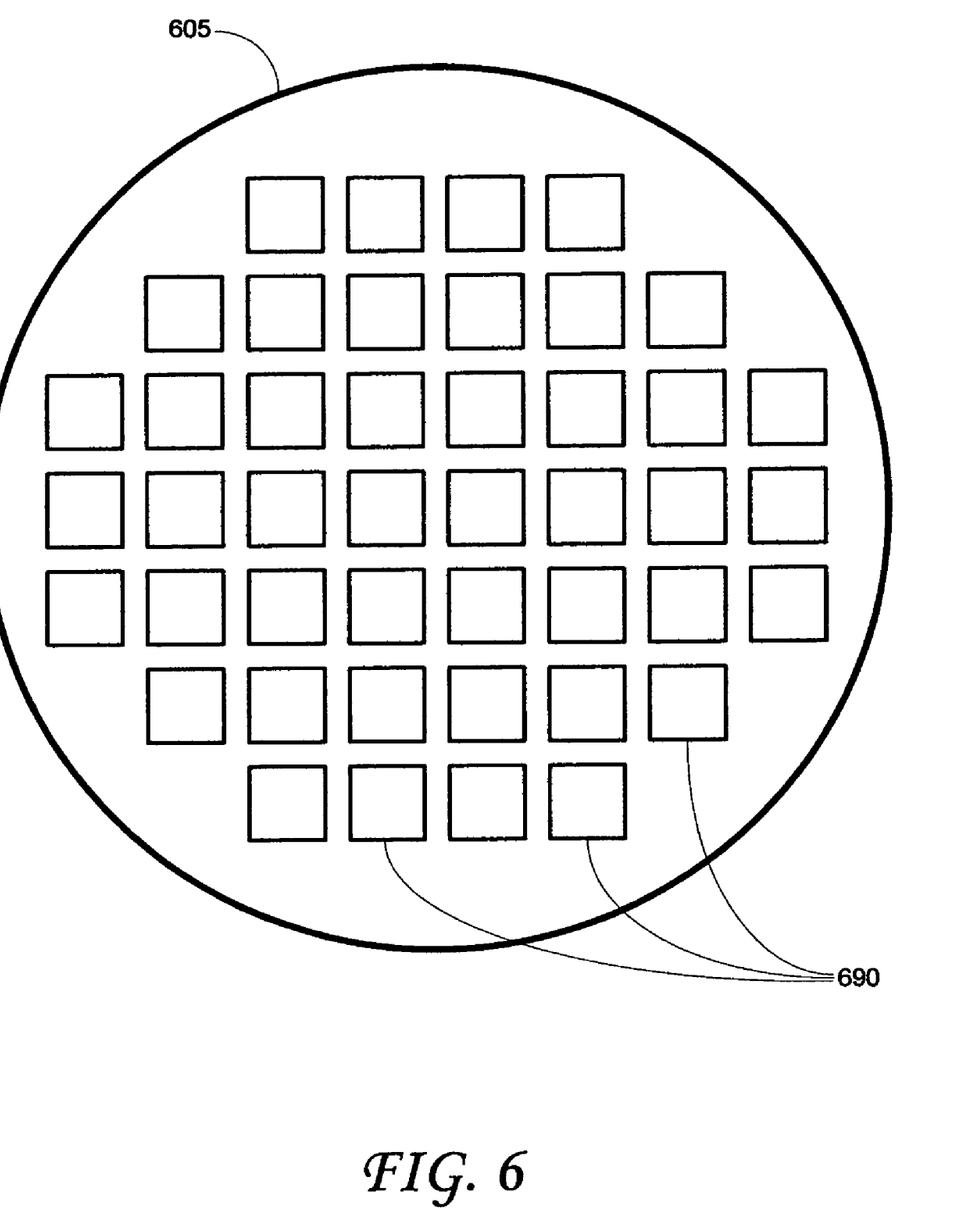
FIG. 6 is a schematic diagram illustrating an embodiment of a wafer upon which integrated circuit devices having a compliant material under one or more bond pads may be formed.

At this juncture, it should be noted that, although one IC device 100 comprising a single die 110 is shown in FIG. 1, the above-described embodiments of a method for fabricating an IC device including a compliant material disposed in the interconnect structure under one or more bond pads are typically performed at the wafer level. This is further illustrated in FIG. 6, which shows a plan view of a wafer 600. The wafer 600 comprises a substrate 605 (e.g., Si, SOI, GaAs, etc.) upon which integrated circuitry for a number of die 690 has been formed, and wafer 600 is ultimately cut into these separate die 690. Prior to singulation of the die 690, a number of levels of metallization will be formed over a surface of the wafer 600 to form the interconnect structure for each die 690 (e.g., the interconnect structure 120, as shown in FIG. 1). According to one embodiment, this interconnect structure disposed over the wafer substrate 605 may include regions of a compliant material, as described above.

At this juncture, it should also be noted that in FIGS. 1 and 2A-2D, as well as FIGS. 4A-4C, only a limited number of circuit elements are shown on the die and, further, that only a limited number of conductors, vias, bond pads, and compliant regions are shown in the die's interconnect structure for ease of illustration. However, as the reader will appreciate, the integrated circuitry formed on die may, in practice, include tens of millions, or even hundreds of millions, of individual circuit elements and, further, that the interconnect structure may include several hundred or even thousands of conductors, vias, and bond pads, as well as compliant regions underlying these bond pads. Thus, it should be understood that the figures are simplified schematic representations of an IC device presented merely as an aid to understanding the disclosed embodiments and, further, that no unnecessary limitations should be drawn from these schematic representations.

Figure 7:
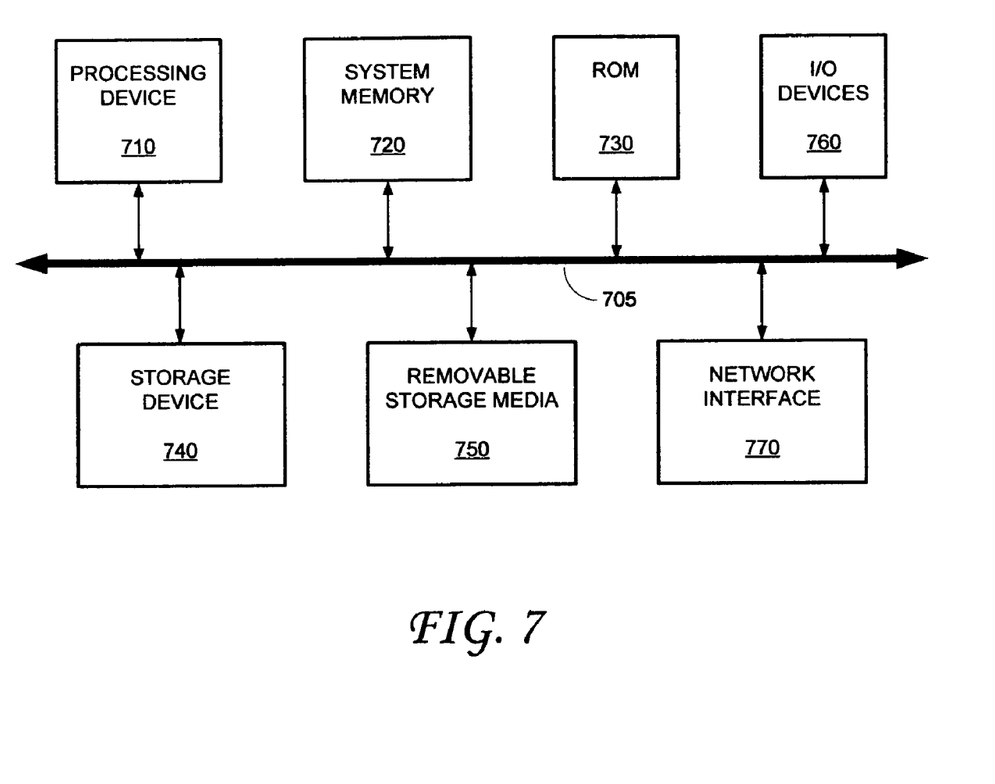
FIG. 7 is a schematic diagram illustrating an embodiment of a computer system, which may include a component formed according to the disclosed embodiments.

Referring to FIG. 7, illustrated is an embodiment of a computer system 700. Computer system 700 includes a bus 705 to which various components are coupled. Bus 705 is intended to represent a collection of one or more buses—e.g., a system bus, a Peripheral Component Interface (PCI) bus, a Small Computer System Interface (SCSI) bus, etc.—that interconnect the components of system 700. Representation of these buses as a single bus 705 is provided for ease of understanding, and it should be understood that the system 700 is not so limited. Those of ordinary skill in the art will appreciate that the computer system 700 may have any suitable bus architecture and may include any number and combination of buses.

Coupled with bus 705 is a processing device (or devices) 710. The processing device 710 may comprise any suitable processing device or system, including a microprocessor, a network processor, an application specific integrated circuit (ASIC), or a field programmable gate array (FPGA), or similar device. It should be understood that, although FIG. 7 shows a single processing device 710, the computer system 700 may include two or more processing devices.

Computer system 700 also includes system memory 720 coupled with bus 705, the system memory 720 comprising, for example, any suitable type and number of memories, such as static random access memory (SRAM), dynamic random access memory (DRAM), synchronous DRAM (SDRAM), or double data rate DRAM (DDRDRAM). During operation of computer system 400, an operating system and other applications may be resident in the system memory 720.

The computer system 700 may further include a read-only memory (ROM) 730 coupled with the bus 705. The ROM 730 may store instructions for processing device 710. The system 700 may also include a storage device (or devices) 740 coupled with the bus 705. The storage device 740 comprises any suitable non-volatile memory, such as, for example, a hard disk drive. The operating system and other programs may be stored in the storage device 740. Further, a device 750 for accessing removable storage media (e.g., a floppy disk drive or a CD ROM drive) may be coupled with bus 705.

The computer system 700 may also include one or more I/O (Input/Output) devices 760 coupled with the bus 705. Common input devices include keyboards, pointing devices such as a mouse, as well as other data entry devices, whereas common output devices include video displays, printing devices, and audio output devices. It will be appreciated that these are but a few examples of the types of I/O devices that may be coupled with the computer system 700.

The computer system 700 may further comprise a network interface 770 coupled with bus 705. The network interface 770 comprises any suitable hardware, software, or combination of hardware and software that is capable of coupling the system 700 with a network (e.g., a network interface card). The network interface 770 may establish a link with the network (or networks) over any suitable medium—e.g., wireless, copper wire, fiber optic, or a combination thereof—supporting the exchange of information via any suitable protocol—e.g., TCP/IP (Transmission Control Protocol/Internet Protocol), HTTP (Hyper-Text Transmission Protocol), as well as others.

It should be understood that the computer system 700 illustrated in FIG. 7 is intended to represent an exemplary embodiment of such a system and, further, that this system may include many additional components, which have been omitted for clarity and ease of understanding. By way of example, the system 700 may include a DMA (direct memory access) controller, a chip set associated with the processing device 710, additional memory (e.g., a cache memory), as well as additional signal lines and buses. Also, it should be understood that the computer system 700 may not include all of the components shown in FIG. 7. The computer system 700 may comprise any type of computing device, such as a desktop computer, a laptop computer, a server, a hand-held computing device (e.g., a personal digital assistant, or PDA), a wireless communication device, an entertainment system, etc.

In one embodiment, the computer system 700 includes a component having a region of compliant material disposed in an interconnect structure under one or more bond pads. For example, the processing device 710 of system 700 may include a die having an interconnect structure including one or more regions of compliant material, each region of compliant material underlying one or more bond pads (and disposed at any level of the interconnect structure). However, it should be understood that other components of system 700 (e.g., network interface 770, a chip set, a memory device such as a flash memory, etc.) may include a device having one or more of the above-described compliant regions.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A device comprising:
   a die having a front side and an opposing back side, the die including a plurality of circuit elements formed on the front side;
   an interconnect structure disposed over the front side of the die, the interconnect structure including a number of layers of a dielectric material, at least one of the dielectric layers including a plurality of conductors, wherein the dielectric material has a modulus of elasticity in a range of approximately 5 to 40 GPa;
   a plurality of conductive bond pads formed in an uppermost dielectric layer of the number of dielectric layers of the interconnect structure; and
   a volume of a compliant material disposed in one of the dielectric layers under at least one of the bond pads, wherein the compliant material comprises a metal and has a modulus of elasticity in a range up to approximately 1 GPa.

2. The device of claim 1, wherein the compliant material comprises a material having a yield strength in a range up to approximately 70 MPa.

3. The device of claim 1, wherein the compliant material comprises a metal selected from a group consisting of indium, tin, lead, and alloys thereof.

4. The device of claim 1, wherein the compliant material comprises a viscoelastic material.

5. The device of claim 1, wherein the volume of compliant material is disposed in the uppermost dielectric layer.

6. The device of claim 1, wherein the volume of compliant material is disposed in a layer of the interconnect structure under the uppermost dielectric layer.

7. The device of claim 1, wherein an entire layer of the number of dielectric layers comprises the compliant material.

8. The device of claim 1, further comprising a second volume of the compliant material disposed in one of the dielectric layers under the at least one bond pad.

9. The device of claim 1, wherein a volume of the compliant material is disposed in one of the dielectric layers under each of the plurality of bond pads.

10. A method comprising:
    providing a semiconductor wafer having a first side and an opposing second side, the wafer including a plurality of circuit elements disposed on the first side, wherein the plurality of circuit elements comprise circuitry for a plurality of die to be cut from the wafer;
    forming an interconnect structure on the first side of the wafer, the interconnect structure including a number of layers of a dielectric material, at least one of the dielectric layers including a plurality of conductors, wherein the dielectric material has a modulus of elasticity in a range of approximately 5 to 40 GPa;
    depositing a volume of a compliant material in one of the dielectric layers, wherein the compliant material has a modulus of elasticity of up to approximately 1 GPa; and
    forming a number of conductive bond pads in an uppermost layer of the number of dielectric layers, one of the bond pads overlying the volume of compliant material.

11. The method of claim 10, wherein the compliant material comprises a material selected from a group consisting of metals and polymers.

12. The method of claim 10, wherein the compliant material comprises a viscoelastic material.

13. The method of claim 10, wherein the volume of compliant material is disposed in the uppermost dielectric layer.

14. The method of claim 10, wherein the volume of compliant material is disposed in a layer of the interconnect structure under the uppermost dielectric layer.

15. The method of claim 10, wherein depositing a volume of the compliant material comprises forming an entire layer of the number of dielectric layers from the compliant material.

16. The method of claim 10, wherein depositing a volume of the compliant material comprises depositing a volume of the compliant material at a number of locations, each location underlying one of the plurality of bond pads.

17. The method of claim 10, further comprising depositing a second volume of the compliant material in one of the dielectric layers, the one bond pad overlying the second volume of compliant material.

18. A method comprising:
   attaching a wirebond to a bond pad disposed on an integrated circuit device, the integrated circuit device including an interconnect structure underlying the bond pad, wherein a region of compliant material disposed in the interconnect structure and underlying the bond pad undergoes plastic deformation during attachment of the wirebond; and
   absorbing at least a portion of stresses associated with the wirebond attachment as a result of the plastic deformation of the region of compliant material.

19. The method of claim 18, wherein the region of compliant material further undergoes elastic deformation.

20. The method of claim 18, wherein the interconnect structure comprises a number of layers of a dielectric material having a modulus of elasticity in a range of approximately 5 to 40 GPa, and the region of compliant material comprises a material having a modulus of elasticity of up to approximately 1 GPa.

21. A device comprising:
   a die having a front side and an opposing back side, the die including a plurality of circuit elements formed on the front side;
   an interconnect structure disposed over the front side of the die, the interconnect structure including a number of layers of a dielectric material, at least one of the dielectric layers including a plurality of conductors, wherein the dielectric material has a modulus of elasticity in a range of approximately 5 to 40 GPa;
   a plurality of conductive bond pads formed in an uppermost dielectric layer of the number of dielectric layers of the interconnect structure; and
   a volume of a compliant material disposed in the uppermost dielectric layer under at least one of the bond pads, wherein the compliant material has a modulus of elasticity in a range up to approximately 1 GPa.

22. The device of claim 21, wherein the compliant material comprises a material selected from a group consisting of metals and polymers.

23. The device of claim 21, wherein the compliant material comprises a material having a yield strength in a range up to approximately 70 MPa.

24. The device of claim 21, wherein the compliant material comprises a viscoelastic material.

25. The device of claim 21, wherein substantially all of the uppermost dielectric layer comprises the compliant material.

26. The device of claim 21, further comprising a second volume of the compliant material disposed in another of the dielectric layers under the at least one bond pad.

27. The device of claim 21, wherein a volume of the compliant material is disposed under each of the plurality of bond pads.

* * * * *